(12) United States Patent
Tanaka et al.

(10) Patent No.: US 12,483,236 B2
(45) Date of Patent: Nov. 25, 2025

(54) SEMICONDUCTOR DEVICE

(71) Applicant: Mitsubishi Electric Corporation, Tokyo (JP)

(72) Inventors: Sho Tanaka, Tokyo (JP); Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 4 days.

(21) Appl. No.: 18/739,482

(22) Filed: Jun. 11, 2024

(65) Prior Publication Data

US 2025/0105837 A1  Mar. 27, 2025

(30) Foreign Application Priority Data

Sep. 26, 2023 (JP) ................. 2023-162433

(51) Int. Cl.
| | |
|---|---|
| H03K 17/16 | (2006.01) |
| H10D 12/00 | (2025.01) |
| H10D 62/10 | (2025.01) |
| H10D 62/13 | (2025.01) |

(52) U.S. Cl.
CPC ......... *H03K 17/168* (2013.01); *H10D 12/481* (2025.01); *H10D 62/127* (2025.01); *H10D 62/133* (2025.01)

(58) Field of Classification Search
CPC .. H03K 17/168; H10D 12/481; H10D 62/127; H10D 62/133; H10D 62/106; H10D 62/142; H10D 64/117; H10D 64/519
USPC .......................................... 327/109
See application file for complete search history.

(56) References Cited

U.S. PATENT DOCUMENTS

| | | | |
|---|---|---|---|
| 2005/0161768 A1* | 7/2005 | Sugiyama ............ | H10D 12/481 257/E29.198 |
| 2025/0105837 A1* | 3/2025 | Tanaka ................. | H10D 62/142 |

FOREIGN PATENT DOCUMENTS

| | | |
|---|---|---|
| JP | 2004-319624 A | 11/2004 |
| JP | 2005-191221 A | 7/2005 |

* cited by examiner

*Primary Examiner* — Ryan Jager
(74) *Attorney, Agent, or Firm* — Studebaker Brackett PLLC

(57) ABSTRACT

An object is to provide a technique that can reduce energy loss during the transient On-period. A semiconductor device includes a first transistor, a second transistor, and a controller. The controller is configured to, before the first transistor enters a transient Off-state, apply a second Off-voltage lower than a first Off-voltage to the second gate, before the first transistor enters a transient On-state, turn On the second transistor, and after the first transistor is turned On, apply the first Off-voltage to the second gate to turn Off the second transistor.

9 Claims, 12 Drawing Sheets

SEMICONDUCTOR DEVICE

BACKGROUND OF THE INVENTION

Field of the Invention

The present disclosure relates to a semiconductor device.

Description of the Background Art

In a power transistor having a switching function, it is ideal for the steady-state On-voltage and the energy loss during transient Off-state to be as small as possible. Basically, the steady-state On-voltage and the energy loss during transient Off-state are in a trade-off relationship, so various technologies have been proposed to reduce these.

In, for example, Japanese Patent Application Laid-Open No. 2004-319624, a technique is proposed to reduce the steady-state On-voltage and the energy loss during transient Off-state by controlling the timing of two gates in a double-gate structure.

Furthermore, a technique has also been devised to limit the saturation current using a double-gate structure for a certain period of time to prevent an element from being destroyed in case of a short circuit to the power supply.

However, in conventional techniques, there was room for improvement in controlling the gate during the transient On-period and reducing energy loss during the transient On-period.

SUMMARY

The present disclosure has been made in view of the above-mentioned problems and an object thereof is to provide a technique that can reduce energy loss during the transient On-period.

According to the present disclosure, a semiconductor device includes a first transistor including a first gate and a first emitter region provided along the first gate, a second transistor adjacent to the first transistor, including a second gate and a second emitter region provided along the second gate, and a controller configured to control On and Off of the first transistor and the second transistor, in which, in plan view, a length of a portion of the second emitter region facing the second gate is greater than a length of a portion of the first emitter region facing the first gate, and the controller is configured to, before the first transistor enters a transient Off-state, apply a second Off-voltage lower than a first Off-voltage to the second gate, before the first transistor enters a transient On-state, turn On the second transistor, and after the first transistor is turned On, apply the first Off-voltage to the second gate to turn Off the second transistor.

The energy loss during the transient On-period can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
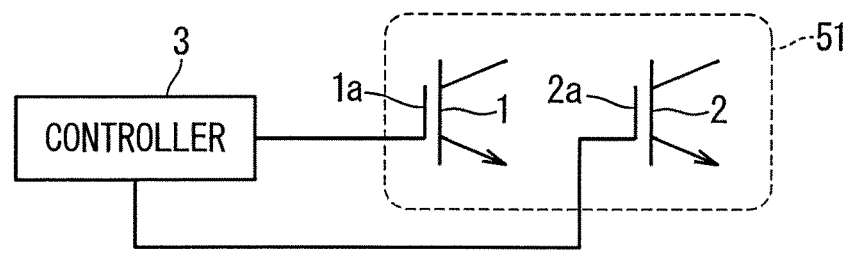
FIG. 1 is a diagram illustrating a configuration of a semiconductor device according to Embodiment 1.

Embodiments will be described below with reference to the accompanying drawings. The features described in each Embodiment below are illustrative, and not all features are necessarily essential. Also, in the description given below, the same or similar reference numerals are given to the same components in a plurality of Embodiments, and different components will be mainly described. Also, in the following description, terms indicating specific positions or directions such as "upper", "lower", "left", "right", "front", and "back" may not necessarily coincide with the positions or directions at the time of implementation. Also, when mentioning a certain part having a higher concentration than another part, this refers, for example, to the average concentration of a certain part being higher than the average concentration of another part. Conversely, when mentioning a certain part having a lower concentration than another part, this refers, for example, to the average concentration of a certain part being lower than the average concentration of another part.

Embodiment 1

FIG. 1 is a diagram illustrating a configuration of a semiconductor device according to Embodiment 1. The semiconductor device in FIG. 1 includes a first transistor 1, a second transistor 2, and a controller 3.

The first transistor 1 and the second transistor 2 are provided on a chip 51 adjacent to each other. In the following, although a configuration in which each of the first transistor 1 and the second transistor 2 is a trench-type Insulated Gate Bipolar Transistor (IGBT) will be mainly described, the configuration is not limited thereto, and a Metal Oxide Semiconductor Field Effect Transistor (MOSFET) may also be adoptable.

The controller 3 controls the voltage at a first gate 1a of the first transistor 1 and the voltage at a second gate 2a of the second transistor 2, thereby controlling On and Off of the first transistor 1 and the second transistor 2. The controller 3 includes, for example, a Central Processing Unit (CPU).

Figure 2:
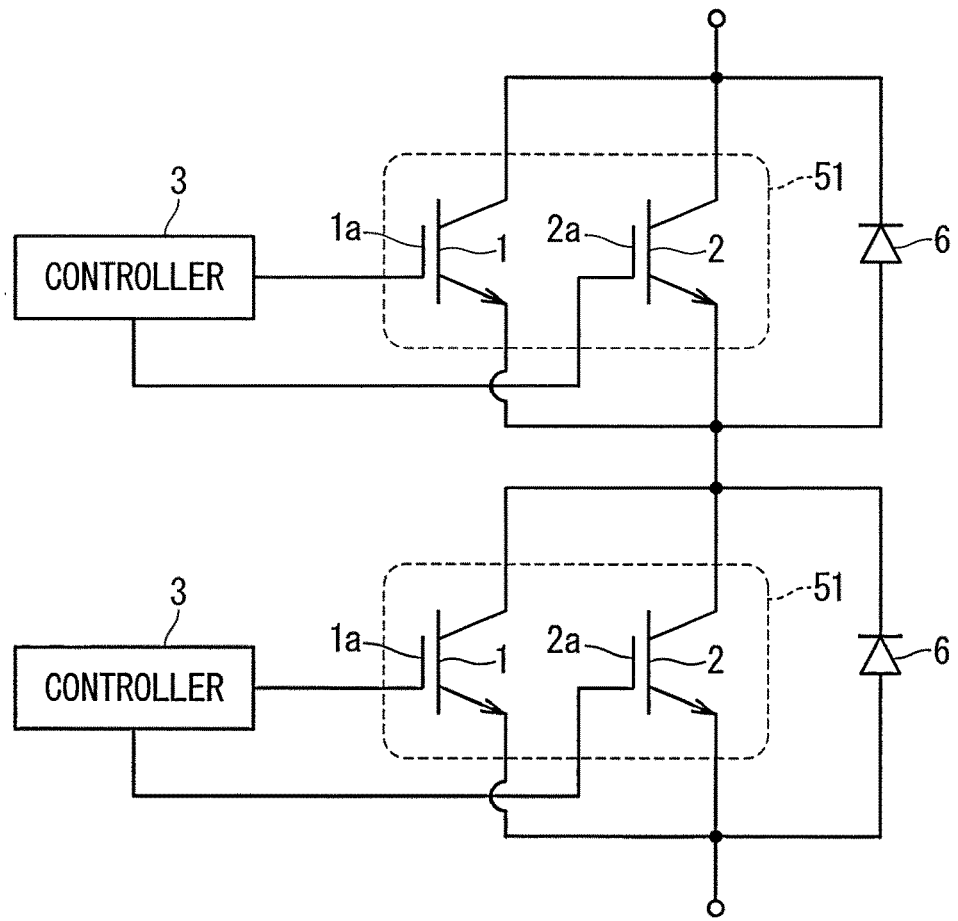
FIG. 2 is a diagram illustrating a configuration of part of a semiconductor module according to Embodiment 1.

FIG. 2 is a diagram illustrating a configuration of an IGBT module, which is a semiconductor module including the configuration of FIG. 1. The upper part and the lower part in FIG. 2 have the same configuration; therefore, only one of these parts will be described here.

With the collector of the first transistor 1 and the collector of the second transistor 2 connected to each other, and with the emitter of the first transistor 1 and the emitter of the second transistor 2 connected to each other, the first transistor 1 and the second transistor 2 are connected in parallel with each other. A diode 6 is connected in parallel to the first transistor 1 and the second transistor 2. The diode 6 may be a diode using a PN junction or a Schottky barrier diode. In FIG. 2, although provided outside the chip 51, the diode 6 may also be provided on the same chip 51 as the first transistor 1 and the second transistor 2, as in a Reverse Conducting-IGBT (RC-IGBT).

Figure 3:
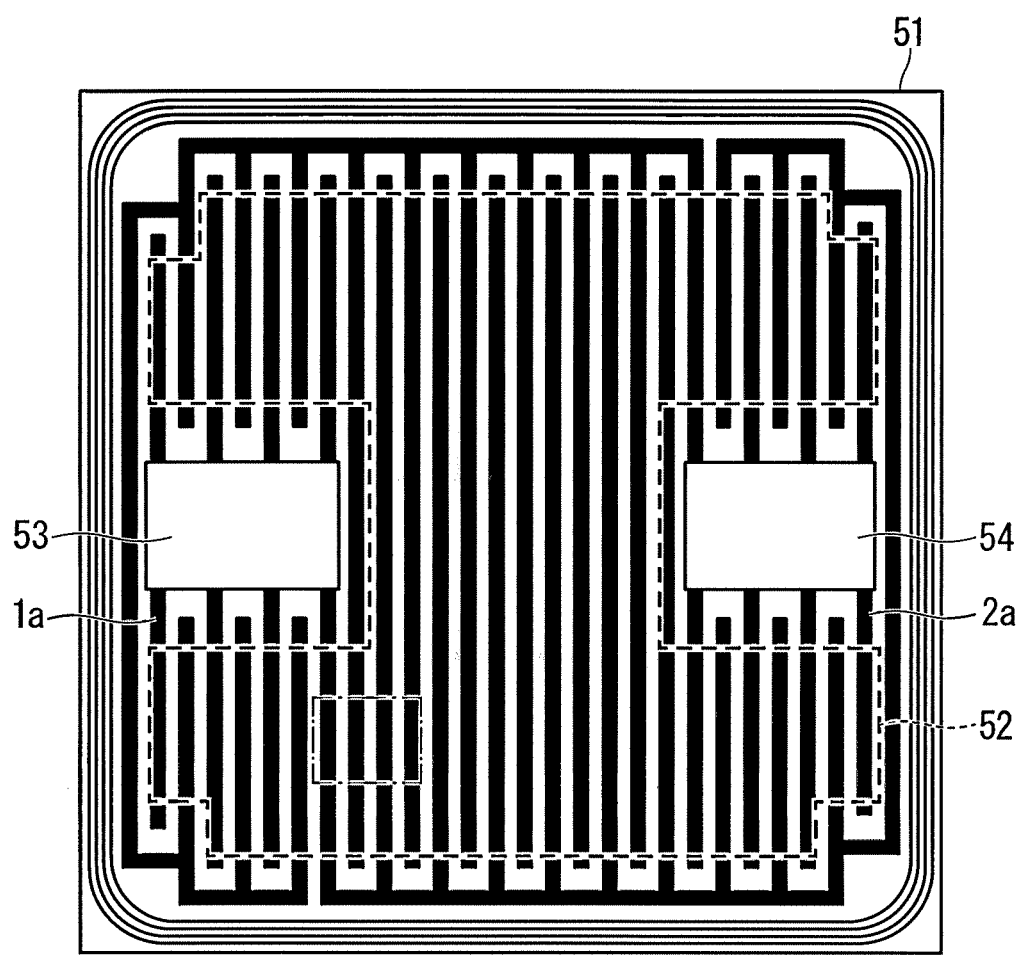
FIG. 3 is a plan view illustrating a configuration of a chip according to Embodiment 1.

FIG. 3 is a plan view illustrating the configuration of the chip 51. The chip 51 includes a cell section 52 in which the first transistor 1 and the second transistor 2 are provided, and a peripheral section of the cell section 52. The cell portion 52 is provided with the first gate 1a of the first transistor 1 and the second gate 2a of the second transistor 2.

In the example of FIG. 3, in order to input a signal from the controller 3 outside the chip 51 to the first gate 1a and the second gate 2a, a pad 53 and a pad 54, which are electrically connected to the first gate 1a and the second gate 2a respectively, are provided on the outer periphery. Note that the chip 51 and the controller 3 may be monolithically (integrated) configured with the controller 3 provided instead of the pads 53 and 54.

Figure 4:
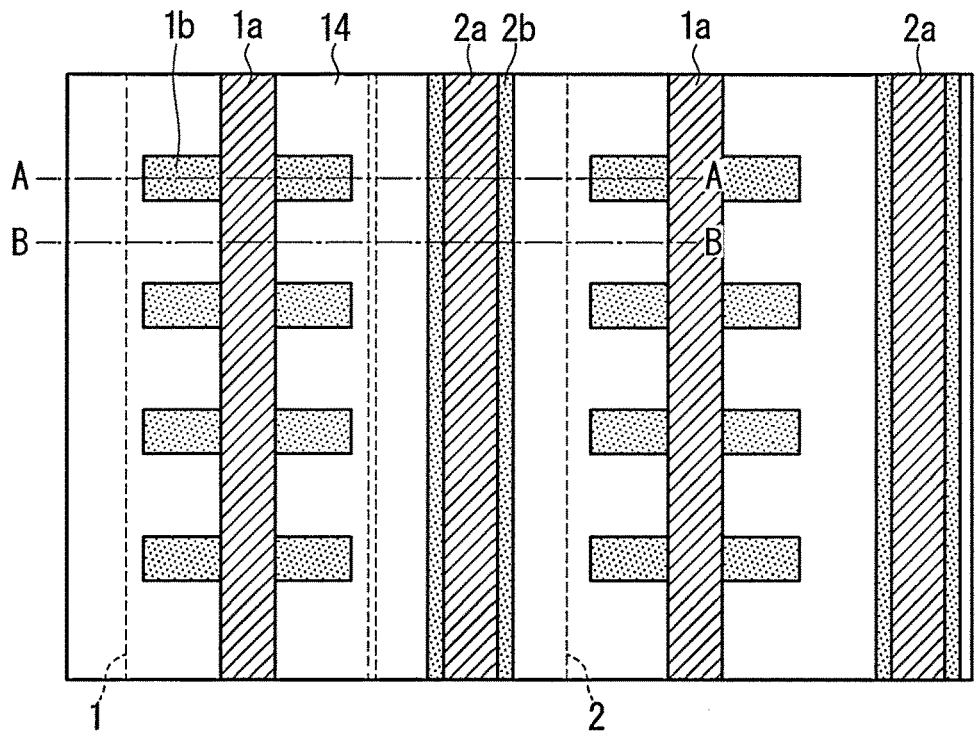
FIG. 4 is an enlarged plan view illustrating the configuration of the semiconductor device according to Embodiment 1.
Figure 5:
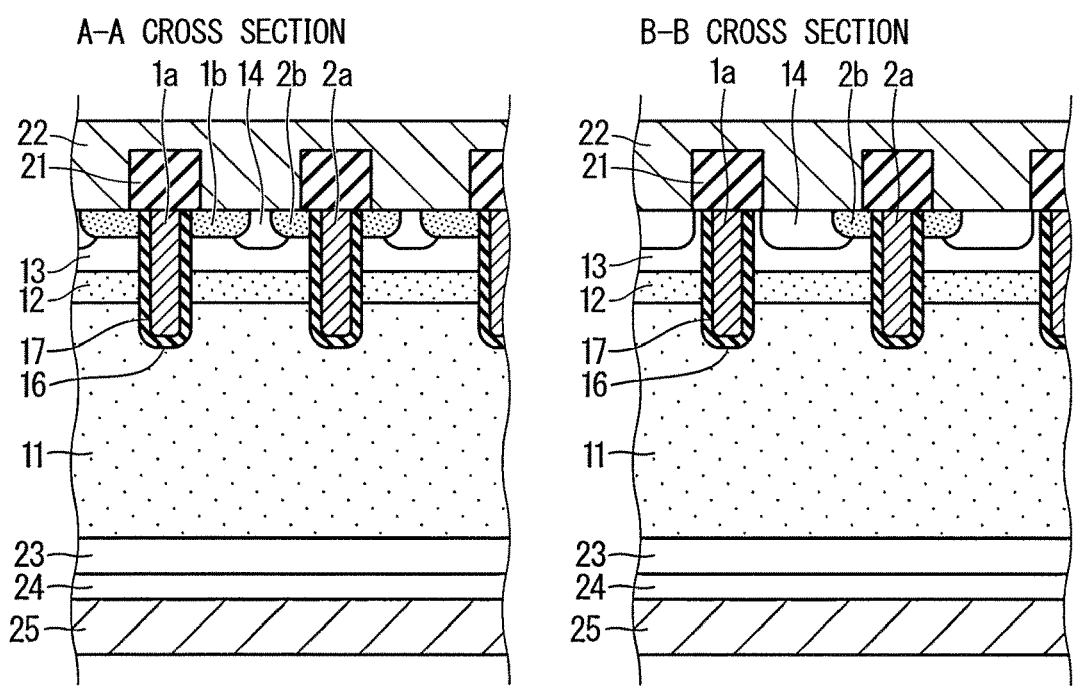
FIG. 5 is a cross-sectional view illustrating the configuration of the semiconductor device according to Embodiment 1.

FIG. 4 is an enlarged plan view illustrating the configuration of the semiconductor device according to Embodiment 1, and specifically, is an enlarged plan view illustrating the portion indicated by the dashed-dotted line in FIG. 3. In the example of FIG. 4, although one first transistor 1 and one second transistor 2 are provided alternately, they may be provided alternately in units other than one, such as two each. FIG. 5 is a cross-sectional view illustrating the configuration taken along line A-A and line B-B in FIG. 4. Note that in FIG. 4, illustration of some of the components in FIG. 5 is omitted for convenience of drawing.

The configurations of the first transistor 1 and the second transistor 2 will be described below. Note that in the following description, n-type and p-type may or may not be reversed.

As illustrated in FIGS. 4 and 5, the first transistor 1 includes the first gate 1a, an $n^+$ type or $n^{++}$ type first emitter region 1b, an $n^-$ type drift layer 11, an n-type charge storage (CS) layer 12, a p-type base layer 13, a $p^+$ type contact layer 14, a gate insulating film 17, an interlayer insulating film 21, an emitter 22, an n-type buffer layer 23, a $p^+$ type collector region 24, and a collector 25.

The CS layer 12 is provided on the drift layer 11, the base layer 13 is provided on the CS layer 12, and the first emitter region 1b and the contact layer 14 are selectively provided on the base layer 13.

A trench 16 is provided across the first emitter region 1b, the base layer 13, the CS layer 12, and the upper portion of the drift layer 11. The first gate 1a is an electrode provided on the inner wall of the trench 16 with a gate insulating film 17 interposed therebetween. The gate insulating film 17 is, for example, an oxide film, and the first gate 1a is composed of, for example, doped polysilicon.

The interlayer insulating film 21 insulates the first gate 1a and the emitter 22. The interlayer insulating film 21 is, for example, an oxide film. The emitter 22 is an electrode electrically connected to the first emitter region 1b and the contact layer 14 via a contact hole in the interlayer insulating film 21. The buffer layer 23, the collector region 24, and the collector 25 are laminated in this order on the lower surface of drift layer 11.

As illustrated in FIGS. 4 and 5, the second transistor 2 includes the second gate 2a and an $n^+$ type or $n^{++}$ type second emitter region 2b. Further, the second transistor 2, similar to the first transistor 1, includes the drift layer 11, the CS layer 12, the base layer 13, the contact layer 14, the gate insulating film 17, the interlayer insulating film 21, the emitter 22, the buffer layer 23, the collector region 24, and the collector 25.

The configuration of the second transistor 2 is generally the same as the configuration of the first transistor 1, except for the first emitter region 1b and the second emitter region 2b. The first emitter region 1b in FIG. 4 is provided intermittently (for example, periodically) along the first gate 1a; therefore, the first emitter region 1b is provided in the cross-sectional configuration along line A-A in FIG. 5, whereas, the first emitter region 1b is not provided in the cross-sectional configuration along the line B-B. On the other hand, the second emitter region 2b in FIG. 4 is continuously provided along the second gate 2a; therefore, the second emitter region 2b is provided both in the cross-sectional configuration along the A-A line and the cross-sectional configuration along the B-B line in FIG. 5. In other words, in FIG. 4 in plan view, the length of the portion of the second emitter region 2b facing the second gate 2a is greater than the length of the portion of the first emitter region 1b facing the first gate 1a.

Note that the first emitter region 1b, the second emitter region 2b, the drift layer 11, the CS layer 12, the base layer 13, the contact layer 14, the gate insulating film 17, the buffer layer 23, and the collector region 24 are included in a semiconductor layer being at least one of a semiconductor substrate and the epitaxial growth layer. In the present specification, the term of at least one of A, B, C, . . . , and Z refers, for example, to any one of all combinations extracted from the group of A, B, C, . . . , and Z, where one or more types are selected from A, B, C, . . . , and Z. The semiconductor layer may be composed of typical silicon (Si), or may be composed of a wide bandgap semiconductor such as silicon carbide (SiC), gallium nitride (GaN), or diamond. When the semiconductor layer is composed of a wide bandgap semiconductor, stable operation at high temperatures and high voltages and increased switching speed are implemented.

Figure 6:
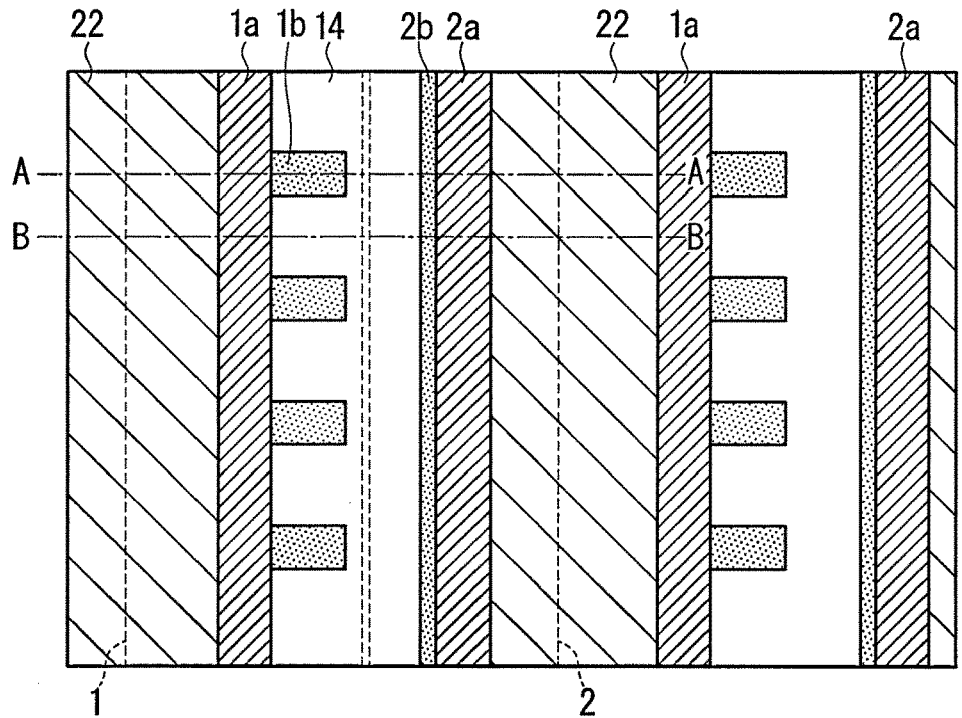
FIG. 6 is an enlarged plan view illustrating the configuration of the semiconductor device according to Embodiment 1.

In the example of FIGS. 4 and 5, all the mesa portions (that is, the upper portion of the semiconductor layer interposed between the first gate 1a and the second gate 2a in FIG. 5) are in contact with the emitter 22, the configuration is not limited thereto. For example, as illustrated in FIGS. 6 and 7, only some of the mesa portions may be in contact with the emitter 22, with the interlayer insulating film 21 being larger than the interlayer insulating film 21 in FIG. 4.

Figure 7:
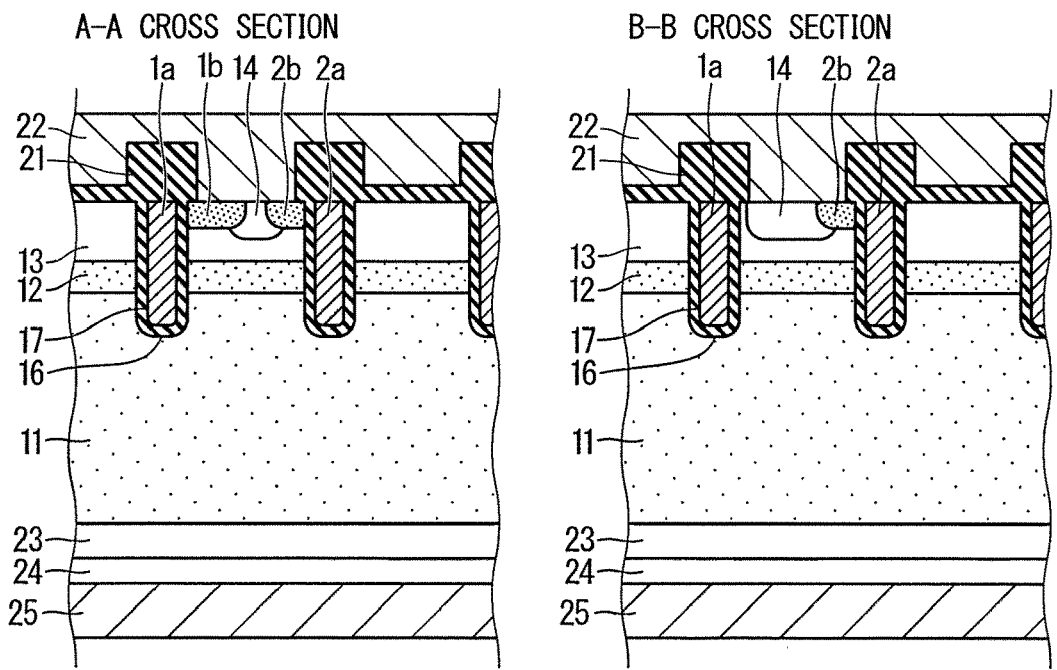
FIG. 7 is a cross-sectional view illustrating the configuration of the semiconductor device according to Embodiment 1.
Figure 8:
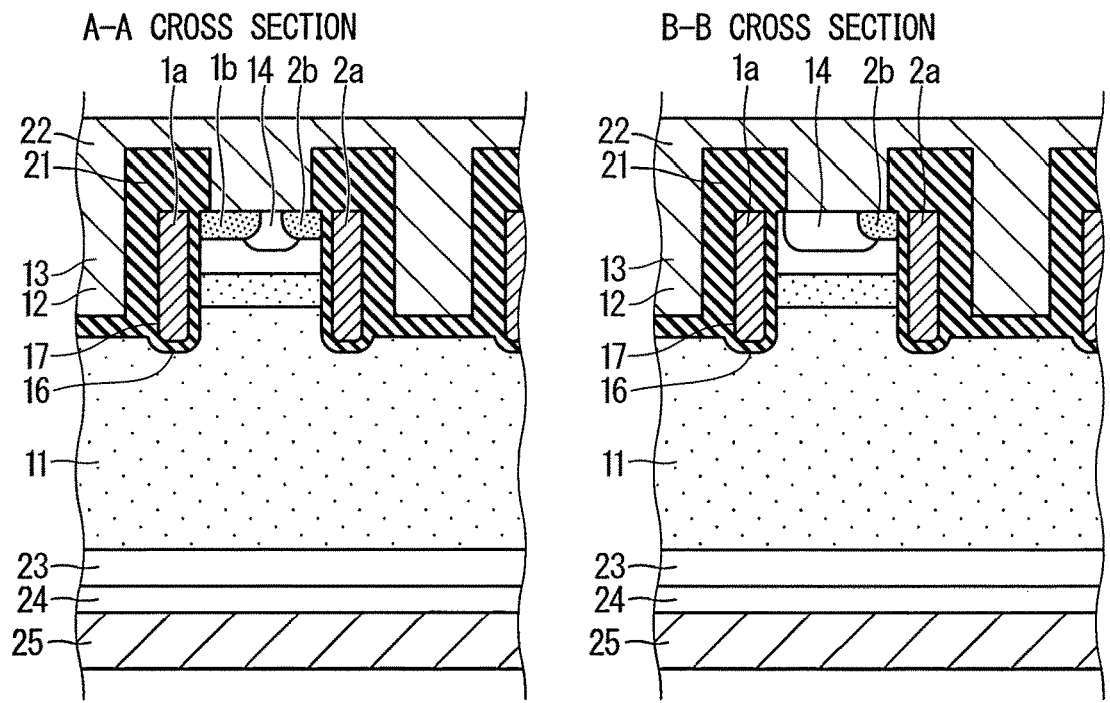
FIG. 8 is a cross-sectional view illustrating the configuration of the semiconductor device according to Embodiment 1.

Further, in FIG. 7, a mesa portion covered with the interlayer insulating film 21 and a mesa portion not covered with the interlayer insulating film 21 have the same height in the vertical direction of in the drawing. However, the configuration thereof is not limited thereto, and the height of the mesa portion covered with the interlayer insulating film 21 and the height of the mesa portion not covered with the interlayer insulating film 21 may be different as illustrated in FIG. 8.

Now, in the above configuration, the controller 3 in FIG. 1 or 2 controls the voltage at the first gate 1a of the first transistor 1 and the voltage at the second gate 2a of the second transistor 2. When a voltage higher than the threshold voltage VGE (th) is applied to the first gate 1a of the first transistor 1, the portion of the semiconductor layer near the gate insulating film 17 of the first gate 1a substantially functions as an n-type semiconductor layer and forms a channel. On the other hand, when a negative bias that is a negative voltage is applied to the first gate 1a, the portion of the semiconductor layer near the gate insulating film 17 of the first gate 1a substantially functions as a p-type semiconductor layer. Similarly, when a voltage higher than the threshold voltage VGE (th) is applied to the second gate 2a of the second transistor 2, the portion of the semiconductor layer near the gate insulating film 17 of the second gate 2a substantially functions as an n-type semiconductor layer and forms a channel. On the other hand, when a negative bias is applied to the second gate 2a, the portion of the semiconductor layer near the gate insulating film 17 of the second gate 2a substantially functions as a p-type semiconductor layer.

Figure 9:
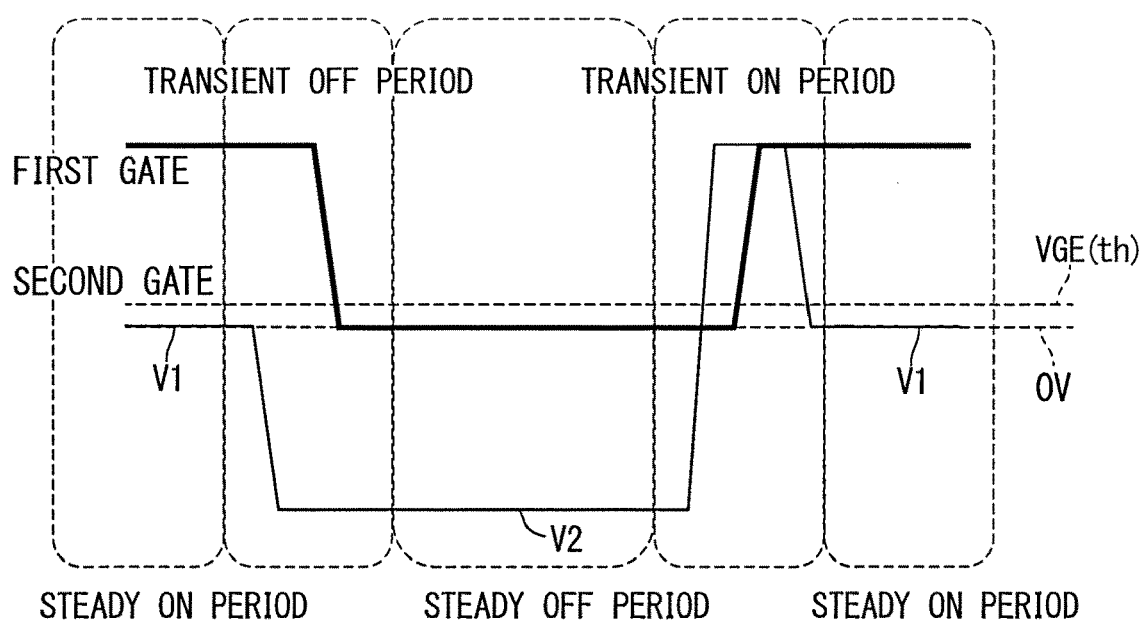
FIG. 9 is a timing chart illustrating control of a controller according to Embodiment 1.

FIG. 9 is a timing chart illustrating control of the controller 3 according to Embodiment 1. FIG. 9 illustrates the voltages at the pad 53 and the pad 54 of the chip 51 in FIG. 3, that is, the voltages at the first gate 1a and the second gate 2a. The threshold voltage VGE (th) of the first transistor 1 and the second transistor 2 is greater than 0V.

The transient Off-state of the first transistor 1 is strictly the state from the On state to the Off state of the first transistor 1, and FIG. 9 illustrates the transient Off-period including the transient Off-state. Similarly, the transient On-state of the first transistor 1 is strictly the state from the Off state to the On state of the first transistor, and FIG. 9 illustrates the transient On-period including the transient On-state.

The controller 3 applies a second Off-voltage V2 lower than the first Off-voltage V1 to the second gate 2a before the first transistor 1 enters the transient Off-state. The controller 3 turns On the second transistor 2 before the first transistor 1 enters the transient On-state. Then, after the first transistor 1 is turned On through the transient On-state, the controller 3 applies the first Off-voltage V1 to the second gate 2a to turn Off the second transistor 2.

Note that in the example of FIG. 9, the first Off-voltage V1 is 0V, and the second Off-voltage V2 is a negative bias. However, it is not limited to this condition, as long as the first Off-voltage V1 and the second Off-voltage V2 are lower than the threshold voltage VGE (th), and the second Off-voltage V2 is lower than the first Off-voltage V1.

Figure 10:
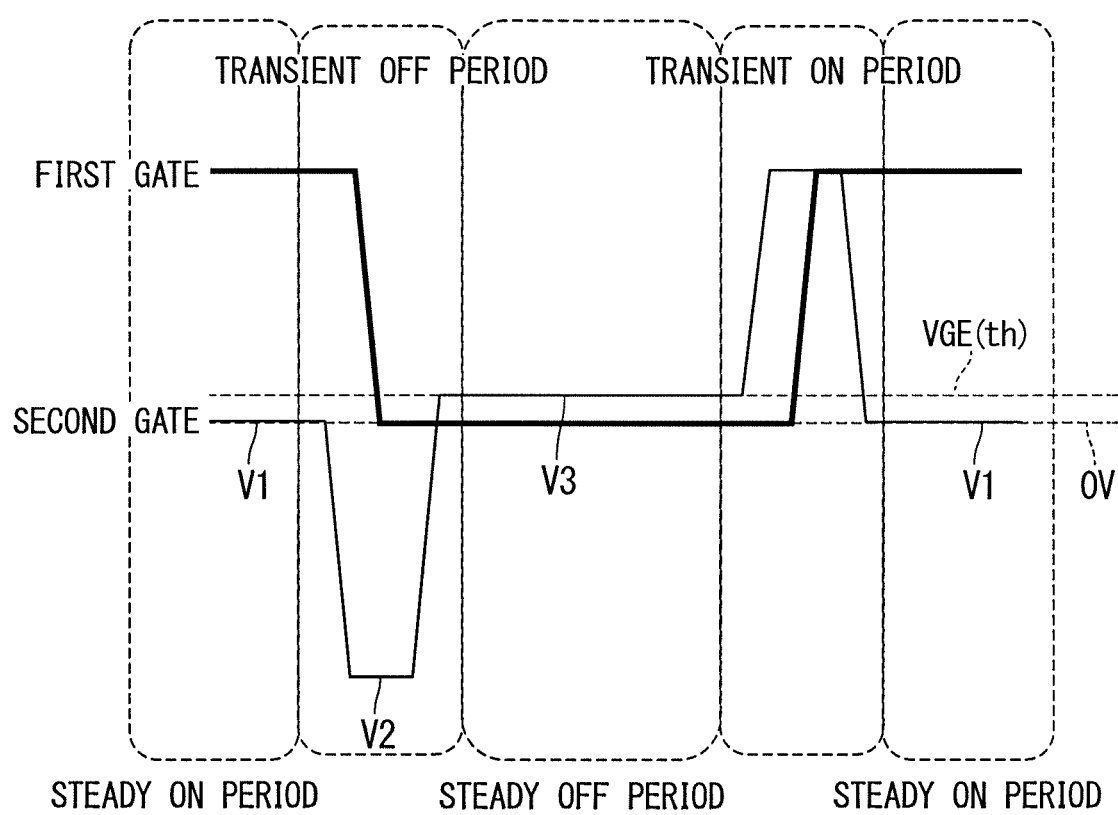
FIG. 10 is a timing chart illustrating the control of the controller according to Embodiment 1.

Further, in the example of FIG. 9, during the steady Off-period from the transient Off-period to the transient On-period of the first transistor 1, the controller 3 maintains the application of the second Off-voltage V2 (that is, negative bias) to the second gate 2a. Also, during the steady On-period from the transient On-period to the transient Off-period of the first transistor 1, the controller 3 maintains the application of the first Off-voltage V1 (that is, 0V) to the second gate 2a. However, the voltage of the second gate 2a during the steady Off-period and the steady On-period is not limited thereto. For example, as illustrated in FIG. 10, during the steady Off-period, the controller 3 may apply a third Off-voltage V3 that is greater than or equal to 0V and less than the threshold voltage VGE (th) to the second gate 2a. According to the above control by the controller 3, the first to third effects can be obtained.

First Effect

The controller 3 applies the second Off-voltage V2 (that is, negative bias) to the second gate 2a before the first transistor 1 enters the transient Off-state. With this, the portion of the semiconductor layer near the gate insulating film 17 of the second gate 2a substantially functions as a p-type semiconductor layer. Therefore, there is an effect that the holes residing in the drift layer 11 are easily discharged from the front surface via the p-type semiconductor layer. As a result, the total amount of holes contributing to conductivity modulation of the first transistor 1 and the second transistor 2 as a whole is reduced. As a result, after this operation, fewer holes are discharged when the first transistor 1 is turned Off, resulting in a smaller tail current and reducing the energy loss (Eoff) during the transient Off-period of the first transistor 1.

Second Effect

The controller 3 turns On the second transistor 2 before the first transistor 1 enters the transient On-state. With this, the energy loss during the transient On-period mainly occurs in the second transistor 2, which is turned On first. Here, in Embodiment 1, in plan view, the length of the portion of the second emitter region 2b facing the second gate 2a is greater than the length of the portion of the first emitter region 1b facing the first gate 1a. Therefore, when the first transistor 1 and the second transistor 2 are turned On individually, the amount of electrons injected at the moment the second transistor 2 turns On becomes greater than the amount of electrons injected into the first transistor 1, so switching of the second transistor 2 is completed earlier than that of the first transistor 1.

With this, the energy loss during the transient On-period when the second transistor 2 is turned On individually is smaller than the energy loss during the transient On-period when the first transistor 1 is turned On individually. As a result, the energy loss Eon in the entire first transistor 1 and second transistor 2 during the transient On-period can be reduced. Also, by turning On the first transistor 1 after turning On the second transistor 2, the first transistor 1 and the second transistor 2 can be turned On with a smaller gate charge than when turning On the first transistor 1 and the second transistor 2 simultaneously.

Third Effect

After the first transistor 1 turns On, the controller 3 applies the first Off-voltage V1 to the second gate 2a to turn Off the second transistor 2, thereby improving the behavior during short-circuit operation mode. In addition, the short-circuit operation mode is a mode in which the main power supply is directly short-circuited to the collector 25 due to a failure in the peripheral circuit, etc. In the short-circuit operation mode, the duration of the steady On-period after the transient On-period being long is preferable. And this duration corresponds to the time until the integrated power, determined by the voltage applied to the IGBT (that is, the voltage of the main power supply) and the current (that is, the saturation current of the IGBT), exceeds the energy tolerance of the IGBT. Further, the current referred to here (the saturation current of the IGBT) depends on the size of the emitter region of the transistor that is turned On.

Here, in Embodiment 1, in plan view, the length of the portion of the second emitter region 2b facing the second gate 2a is greater than the length of the portion of the first emitter region 1b facing the first gate 1a. The above length of the emitter region and the size of the emitter region are in a corresponding relationship; therefore, the saturation current of the first transistor 1 that is On is smaller than the saturation current of the second transistor 2 that is On. In Embodiment 1, due to the second transistor 2, which has a large saturation current, being turned Off after the first transistor 1, which has a small saturation current, is turned On, the duration during which the short-circuit operation mode occurs can be extended.

Embodiment 2

Figure 11:
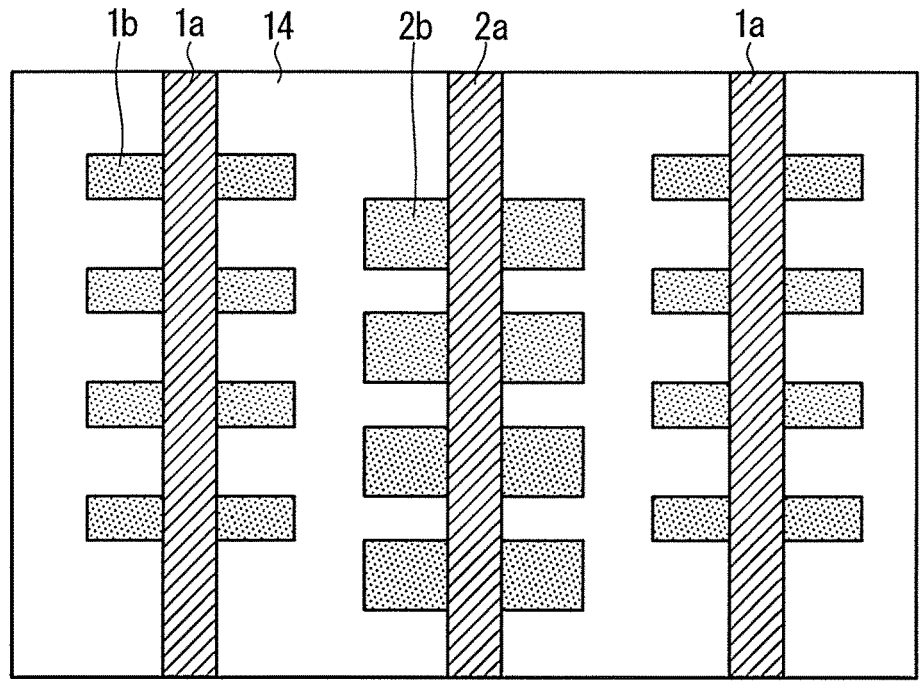
FIG. 11 is an enlarged plan view illustrating a configuration of a semiconductor device according to Embodiment 2.

FIG. 11 is an enlarged plan view illustrating a configuration of a semiconductor device according to Embodiment 2. In Embodiment 1, the second emitter region 2b is continuously provided along the second gate 2a in plan view of FIG. 4. Embodiment 2 differs from Embodiment 1 in that the second emitter region 2b is provided intermittently (for example, periodically) along the second gate 2a in plan view of FIG. 11.

In plan view as illustrated in the example of FIG. 11, the first emitter region 1b and the second emitter region 2b may be alternately arranged so that the lower portion and the upper portion of the first emitter region 1b correspond to the upper portion and the lower portion of the second emitter region 2b, respectively. Alternatively, the first emitter region 1b and the second emitter region 2b are arranged according to a certain rule so that the upper portion of the first emitter region 1b and the upper portion of the second emitter region 2b correspond to each other in plan view.

With such a configuration, by thinning out the second emitter region 2b, the potential directly beneath the second emitter region 2b can be reduced, thereby enhancing the latch-up resistance of the semiconductor device.

Embodiment 3

Figure 12:
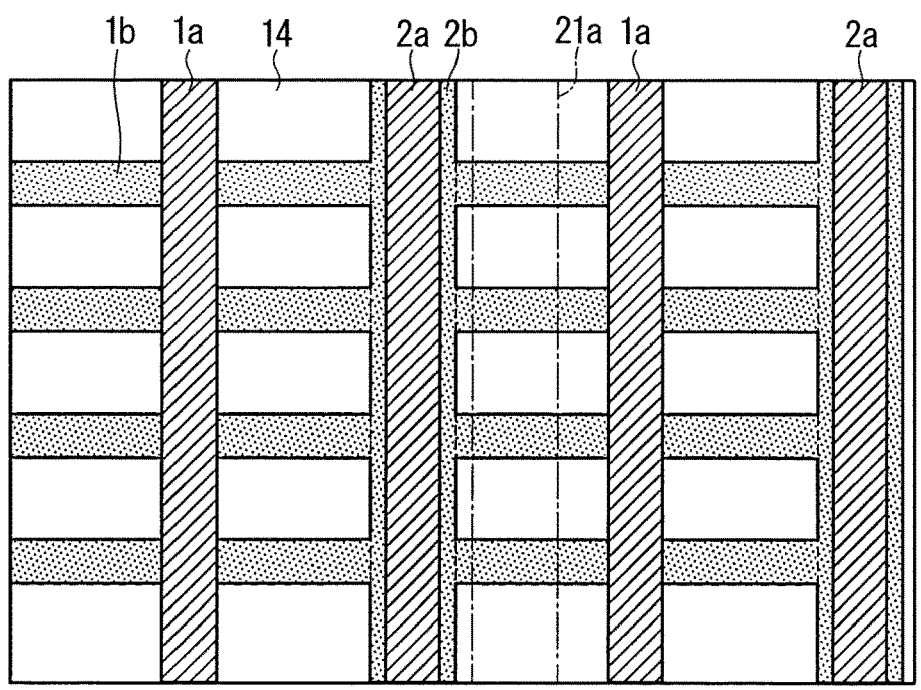
FIG. 12 is an enlarged plan view illustrating a configuration of a semiconductor device according to Embodiment 3.

FIG. 12 is an enlarged plan view illustrating a configuration of a semiconductor device according to Embodiment 3. Embodiment 3 differs from Embodiment 1 in that the first emitter region 1b and the second emitter region 2b are connected to each other in plan view.

Here, the first emitter region 1b and the second emitter region 2b need to be electrically connected to the emitter 22 via a contact hole in the interlayer insulating film 21. Therefore, in Embodiments 1 and 2, the width of the contact hole in the interlayer insulating film 21 is limited by the arrangement of the first emitter region 1b and the second emitter region 2b. On the other hand, in Embodiment 3, the first emitter region 1b and the second emitter region 2b are connected to each other as illustrated in FIG. 12, eliminating such limitation and enhancing the degree of freedom in designing the contact hole.

Embodiment 4

Figure 13:
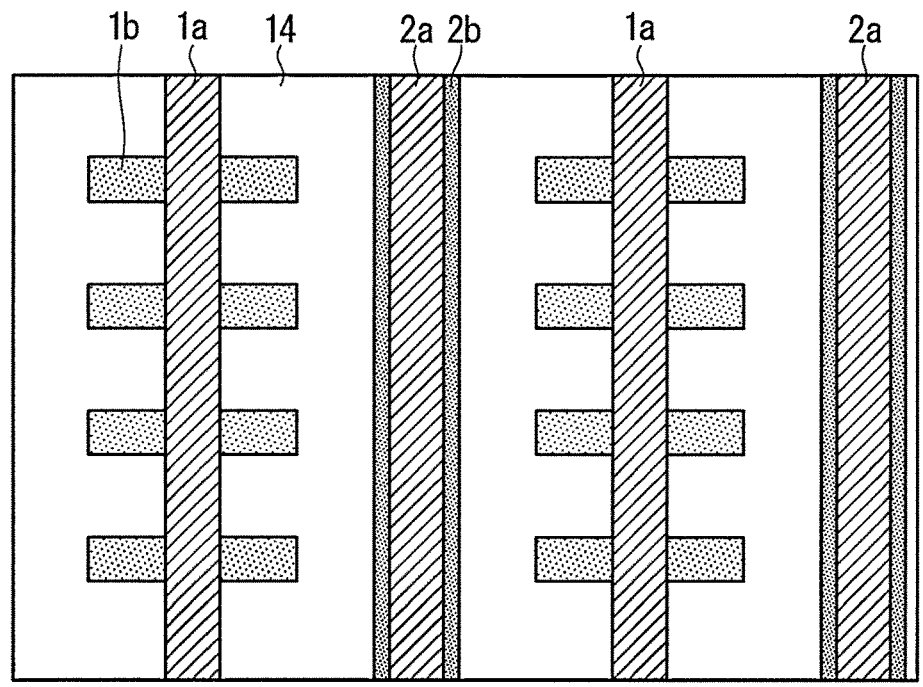
FIG. 13 is an enlarged plan view illustrating a configuration of a semiconductor device according to Embodiment 4.
Figure 14:
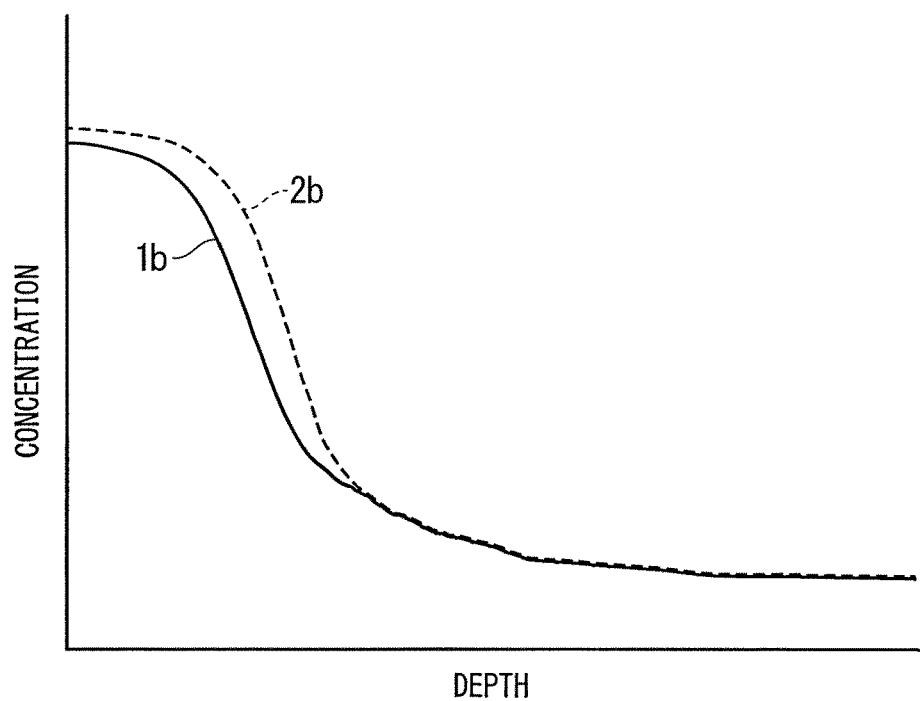
FIG. 14 is a graph illustrating impurity profiles of a first emitter region and a second emitter region according to Embodiment 4.

FIG. 13 is an enlarged plan view illustrating a configuration of a semiconductor device according to Embodiment 4, and FIG. 14 is a graph illustrating impurity profiles of the first emitter region 1b and the second emitter region 2b. The horizontal axis in FIG. 14 indicates the depth from the front surface of the semiconductor layer (that is, the front surface of each of the first emitter region 1b and the second emitter region 2b), and the vertical axis in FIG. 14 indicates the impurity concentration.

As illustrated in FIG. 14, the peak of the n-type impurity concentration in the first emitter region 1b and the peak of the n-type impurity concentration in the second emitter region 2b are located on the upper surface side of the semiconductor layer. Embodiment 4 differs from Embodiment 1 in that the peak of the n-type impurity concentration in the second emitter region 2b is larger than the peak of the n-type impurity concentration in the first emitter region 1b.

According to such a configuration, the amount of electrons injected at the moment the second transistor 2 is turned On is larger, completing switching earlier than that of the first transistor. As a result, the amount of electrons injected at the moment when the second transistor 2 is turned On becomes larger than the amount of electrons injected into the first transistor 1; therefore, the energy loss Eon in the entire first transistor 1 and second transistor 2 during the transient On-period can be reduced. Note that Embodiment 4 as described above is also applicable to Embodiments 2 and 3.

Embodiment 5

Figure 15:
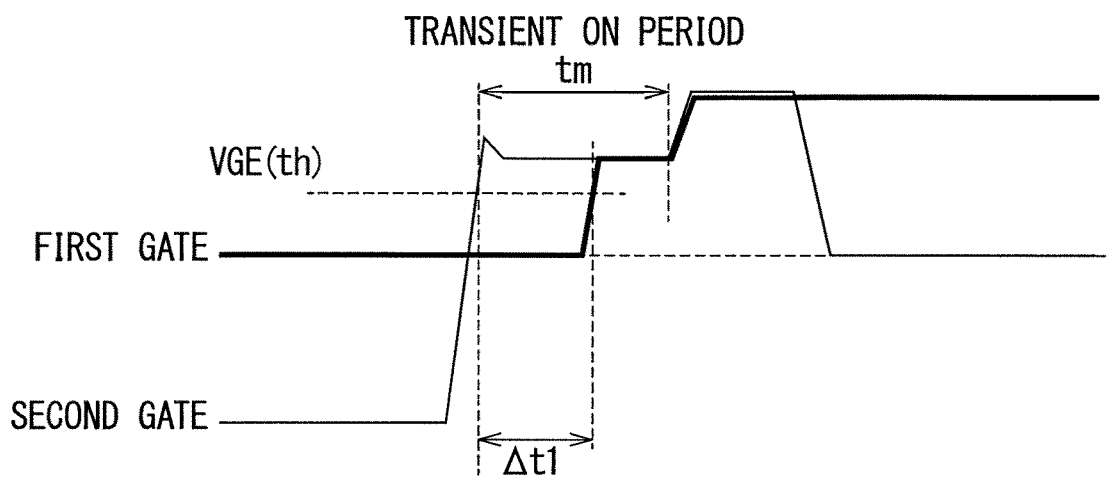
FIG. 15 is a timing chart illustrating control of the controller according to Embodiment 5.

FIG. 15 is a timing chart illustrating control of the controller 3 according to Embodiment 5, and specifically illustrates the control during the transient On-period of the first transistor 1. Embodiment 5 differs from Embodiment 1 in that $0 < \Delta t1 < tm$ is satisfied where $\Delta t1$ represents the time from when the second transistor 2 is turned On until the first transistor 1 is turned On, and tm represents the Miller interval of the second transistor 2. Note that the Miller interval is a period in which the voltage at the gate is constant when the transistor is turned On due to the effective capacitance between the gate and the collector of the transistor.

Figure 16:
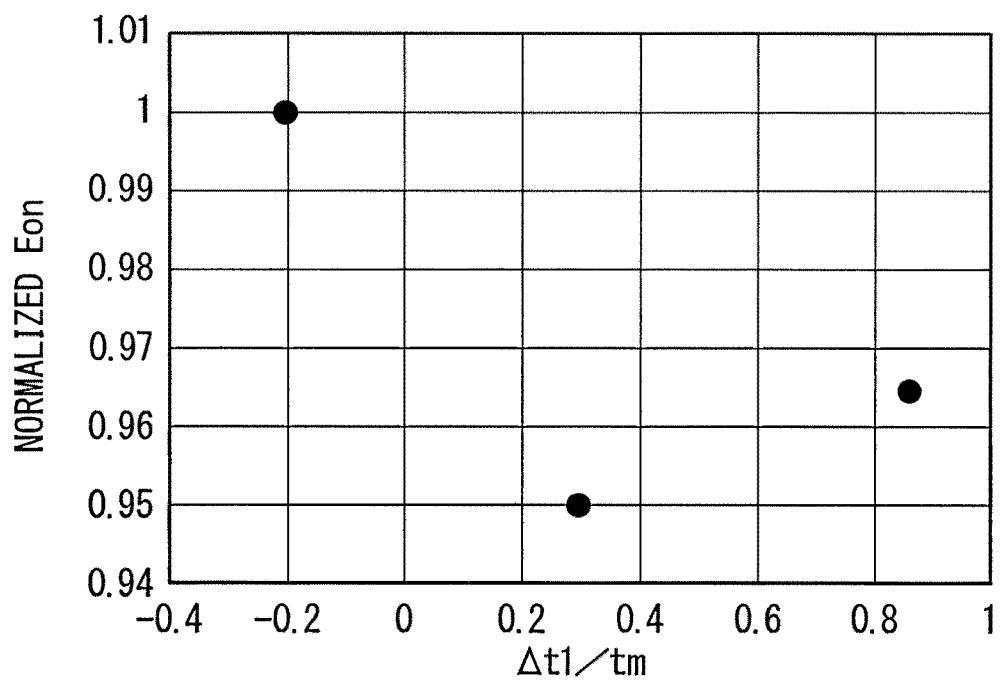
FIG. 16 is a graph illustrating the relationship between $\Delta t1/tm$ and the energy loss Eon.

FIG. 16 is a graph illustrating the relationship between the ratio of tm to $\Delta t1$, that is, $\Delta t1/tm$ (horizontal axis), and the energy loss Eon (vertical axis) in the entire first transistor 1 and second transistor 2 during the transient On-period. Note that the energy loss Eon indicated on the vertical axis is normalized by the energy loss Eon when $\Delta t1/tm=-0.2$ (that is, when the first transistor 1 rises before the Miller interval of the second transistor 2).

In the part where $0<\Delta t1<tm$ holds, that is, in the part greater than 0 and less than 1 on the horizontal axis in FIG. 16, the energy loss Eon can be reduced compared to the case where the energy loss Eon is $\Delta t1/tm=-0.2$. In particular, among the results in FIG. 16, the energy loss Eon can be minimized when $\Delta t1/tm-0.3$. Note that Embodiment 5 as described above is also applicable to Embodiments 2 to 4.

Embodiment 6

Figure 17:
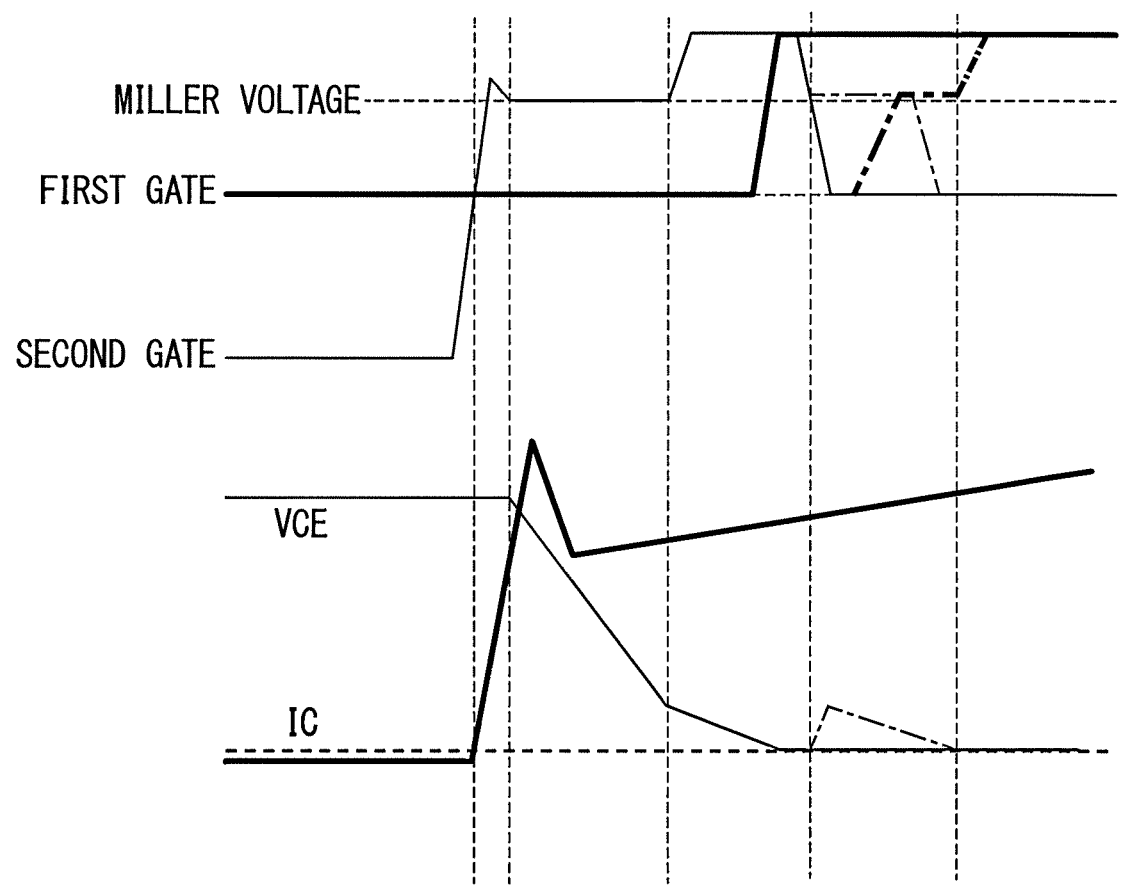
FIG. 17 is a timing chart illustrating control of the controller according to Embodiment 6.

FIG. 17 is a timing chart illustrating control of the controller 3 according to Embodiment 6, and specifically relates to the control during the transient On-period and the main voltage VCE and main current IC of the semiconductor device. Embodiment 6 differs from Embodiment 1 in that, while the first transistor 1 is in the transient On-state, the voltage of the first gate 1a exceeds the Miller voltage before the voltage of the second gate 2a falls below the Miller voltage.

The dashed-dotted line in FIG. 17 illustrates a waveform when the voltage at the first gate 1a exceeds the Miller voltage after the voltage at the second gate 2a falls below the Miller voltage. In this case, after the voltage at the first gate 1a rises until the voltage at the second gate 2a falls below the Miller voltage, the voltage VCE, which once became 0, becomes greater than 0, leading to an increase in the energy loss Eon by that amount.

The solid line in FIG. 17 illustrates a waveform under control according to Embodiment 6, that is, the waveform when the voltage at the first gate 1a exceeds the Miller voltage before the voltage at the second gate 2a falls below the Miller voltage. In this case, the voltage VCE, which once became 0, remains 0; therefore, the energy loss Eon can be reduced more than that in the above case. Note that Embodiment 6 as described above is also applicable to Embodiments 2 to 5.

Embodiment 7

Figure 18:
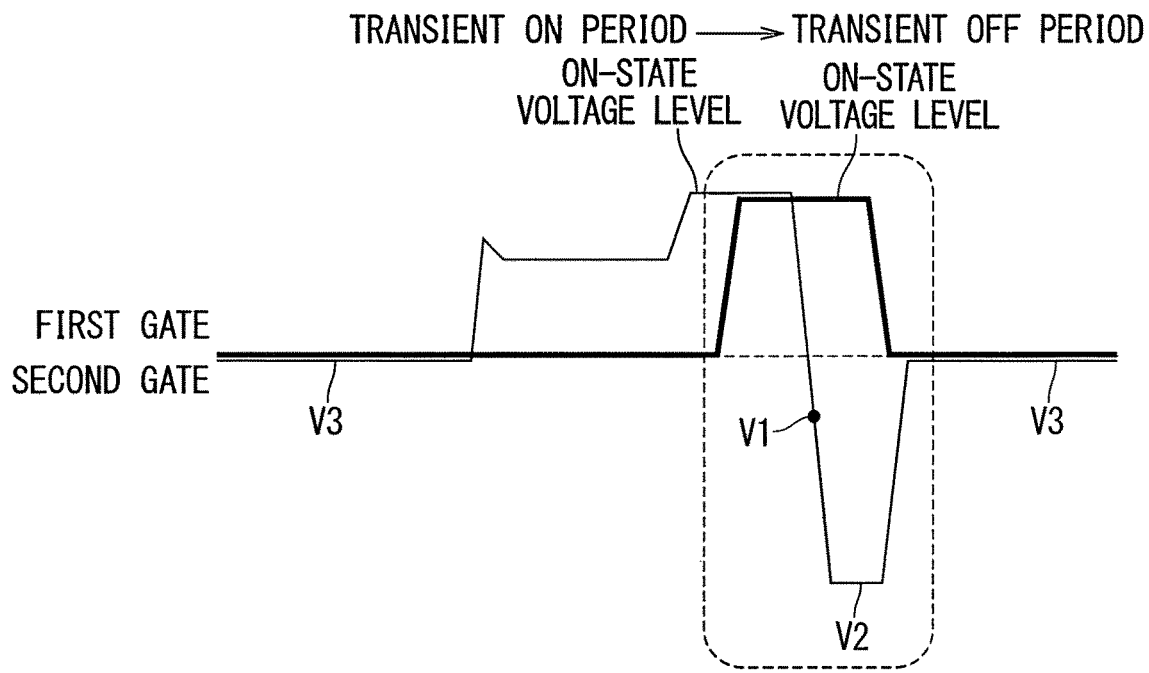
FIG. 18 is a timing chart illustrating control of the controller according to Embodiment 7.

FIG. 18 is a timing chart illustrating control of the controller 3 according to Embodiment 7, and specifically illustrates the control during the transient On-period and the transient Off-period of the first transistor 1. In Embodiment 7, the control is similar to the one of FIG. 10 described in Embodiment 1, in which a change is made so that the first transistor 1 transitions from the state of the transient On-period to the state of the transient Off-period without passing through the state of the steady On-period. Specifically, Embodiment 7 differs from Embodiment 1 in that, when the first transistor 1 enters the transient Off-state immediately after the transient On-state, the controller 3 changes the voltage of the second gate 2a from the On-state voltage level to the second Off-voltage V2 without maintaining the voltage of the second gate 2a at the first Off-voltage V1.

Figure 19:
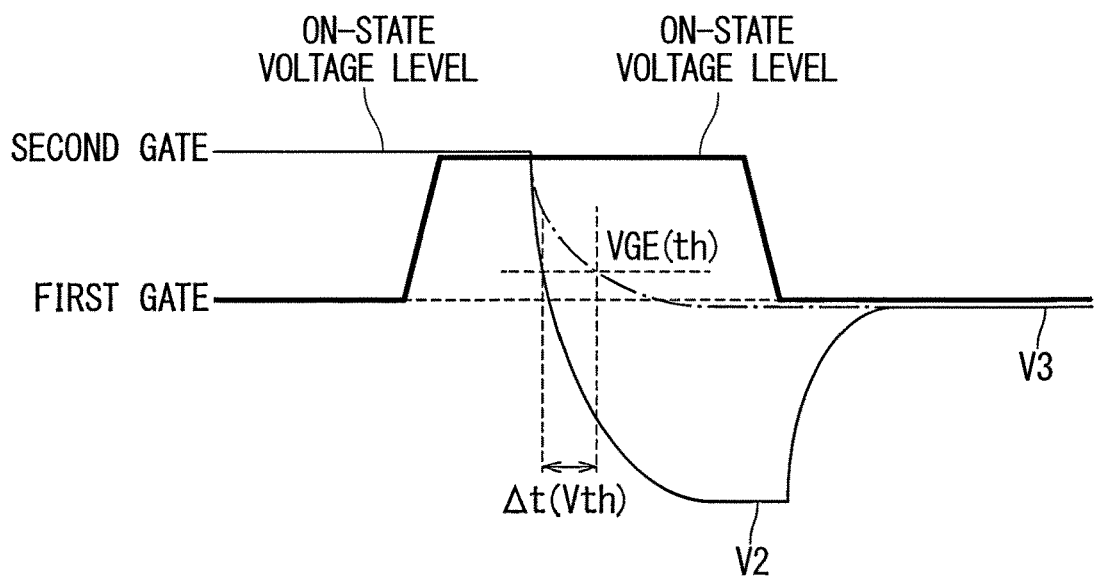
FIG. 19 is a timing chart illustrating control of the controller according to Embodiment 7.

FIG. 19 is a graph of enlarged part of FIG. 18. The dashed-dotted line in FIG. 19 illustrates a waveform when the controller 3 controls the voltage of the second gate 2a from the On-voltage to the third Off-voltage V3, and the solid line in FIG. 19 illustrates waveforms under control of the controller 3 according to Embodiment 7.

In order to turn Off the second transistor 2 earlier than the first transistor 1, the voltage at the second gate 2a needs to reach the threshold voltage VGE (th) earlier than the voltage at the first gate 1a. On the other hand, according to Embodiment 7, the controller 3 can turn Off the second transistor 2 earlier by the time Δt (Vth) in FIG. 19 than controlling the voltage of the second gate 2a from the On-voltage to the third Off-voltage V3. As a result, the period during which the first transistor 1 is in the On state can be shortened. Note that Embodiment 7 described above is also applicable to FIG. 9 described in Embodiment 1, and in this case, the voltage of the second gate 2a is maintained at the second Off-voltage V2 during the steady Off-period after the transient Off-period. Note that Embodiment 7 is also applicable to Embodiments 2 to 6.

Embodiment 8

Figure 20:
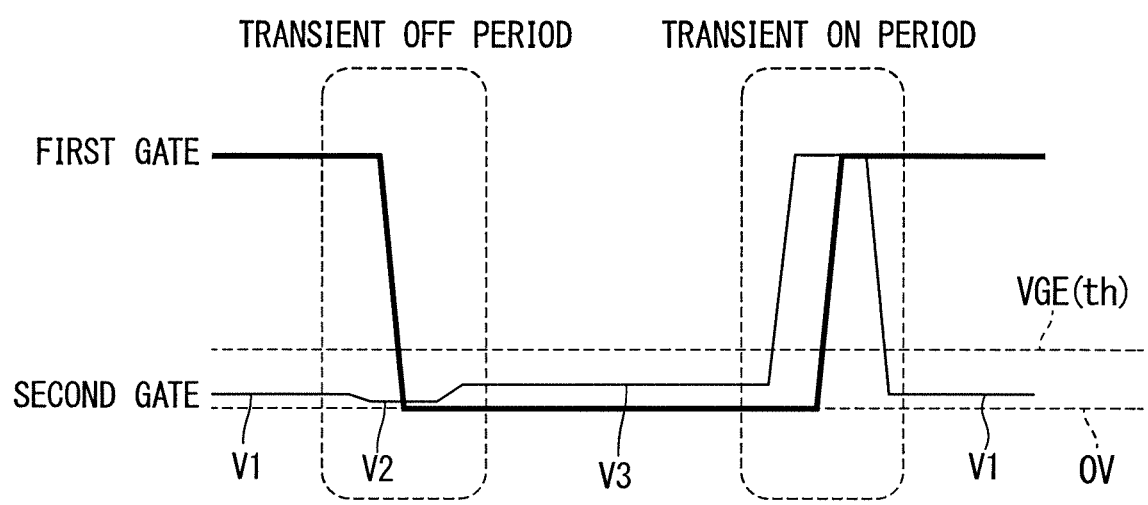
FIG. 20 is a timing chart illustrating control of the controller according to Embodiment 8.

FIG. 20 is a timing chart illustrating control of the controller 3 according to Embodiment 8. Embodiment 8 differs from Embodiment 1 in that the second Off-voltage V2 is 0V or more, the first Off-voltage V1 is greater than the second Off-voltage V2, and the third Off-voltage V3 is greater than the second Off-voltage V2.

Such a configuration eliminates preparation for a power supply for the controller 3 to turn the second gate 2a into a negative bias, leading to an expected simplification of the configuration of the semiconductor device. Note that Embodiment 8 as described above is also applicable to FIG. 9 as well as Embodiments 2 to 7.

It should be noted that Embodiments and Modification can be arbitrarily combined and Embodiments and Modifications can be appropriately modified or omitted.

Hereinafter, the aspects of the present disclosure will be collectively described as Appendices.

Appendix 1

A semiconductor device comprising:
a first transistor including a first gate and a first emitter region provided along the first gate;
a second transistor adjacent to the first transistor, including a second gate and a second emitter region provided along the second gate; and
a controller configured to control On and Off of the first transistor and the second transistor, wherein,
in plan view, a length of a portion of the second emitter region facing the second gate is greater than a length of a portion of the first emitter region facing the first gate, and
the controller is configured to,
before the first transistor enters a transient Off-state, apply a second Off-voltage lower than a first Off-voltage to the second gate,
before the first transistor enters a transient On-state, turn On the second transistor, and
after the first transistor is turned On, apply the first Off-voltage to the second gate to turn Off the second transistor.

Appendix 2

The semiconductor device according to Appendix 1, wherein,
in plan view, the first emitter region is provided intermittently along the first gate, and the second emitter region is provided continuously along the second gate.

Appendix 3

The semiconductor device according to Appendix 1, wherein,
in plan view, the first emitter region is provided intermittently along the first gate, and the second emitter region is provided intermittently along the second gate.

Appendix 4

The semiconductor device according to any one of Appendices 1 to 3, wherein,
in plan view, the first emitter region and the second emitter region are connected to each other.

Appendix 5

The semiconductor device according to any one of Appendices 1 to 4, wherein a peak of an impurity concentration of the second emitter region is larger than a peak of an impurity concentration of the first emitter region.

Appendix 6

The semiconductor device according to any one of Appendices 1 to 5, wherein
0<$\Delta t1$<tm is satisfied wherein $\Delta t1$ represents time from when the second transistor is turned On until the first transistor is turned On, and tm represents Miller interval of the second transistor.

Appendix 7

The semiconductor device according to any one of Appendices 1 to 6, wherein,
while the first transistor is in the transient On-state, a voltage of the first gate exceeds a Miller voltage before a voltage of the second gate falls below the Miller voltage.

Appendix 8

The semiconductor device according to any one of Appendices 1 to 7, wherein,
when the first transistor enters the transient Off-state immediately after the transient On-state, the controller is configured to change the voltage of the second gate from the On-voltage to the second Off-voltage without maintaining the voltage of the second gate at the first Off-voltage.

Appendix 9

The semiconductor device according to any one of Appendices 1 to 8, wherein
the second Off-voltage is 0V or higher.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a first transistor including a first gate and a first emitter region provided along the first gate;
a second transistor adjacent to the first transistor, including a second gate and a second emitter region provided along the second gate; and
a controller configured to control On and Off of the first transistor and the second transistor, wherein,
in plan view, a length of a portion of the second emitter region facing the second gate is greater than a length of a portion of the first emitter region facing the first gate, and
the controller is configured to,
before the first transistor enters a transient Off-state, apply a second Off-voltage lower than a first Off-voltage to the second gate,
before the first transistor enters a transient On-state, turn On the second transistor, and
after the first transistor is turned On, apply the first Off-voltage to the second gate to turn Off the second transistor.

2. The semiconductor device according to claim 1, wherein,
in plan view, the first emitter region is provided intermittently along the first gate, and the second emitter region is provided continuously along the second gate.

3. The semiconductor device according to claim 1, wherein,
in plan view, the first emitter region is provided intermittently along the first gate, and the second emitter region is provided intermittently along the second gate.

4. The semiconductor device according to claim 1, wherein,
in plan view, the first emitter region and the second emitter region are connected to each other.

5. The semiconductor device according to claim 1, wherein
a peak of an impurity concentration of the second emitter region is larger than a peak of an impurity concentration of the first emitter region.

6. The semiconductor device according to claim 1, wherein
0<$\Delta t1$<tm is satisfied wherein $\Delta t1$ represents time from when the second transistor is turned On until the first transistor is turned On, and tm represents Miller interval of the second transistor.

7. The semiconductor device according to claim 1, wherein,
while the first transistor is in the transient On-state, a voltage of the first gate exceeds a Miller voltage before a voltage of the second gate falls below the Miller voltage.

8. The semiconductor device according to claim 1, wherein,
when the first transistor enters the transient Off-state immediately after the transient On-state, the controller is configured to change the voltage of the second gate from the On-voltage to the second Off-voltage without maintaining the voltage of the second gate at the first Off-voltage.

9. The semiconductor device according to claim 1, wherein
the second Off-voltage is 0V or higher.

* * * * *